(12) United States Patent
Ueda

(10) Patent No.: US 6,432,204 B1
(45) Date of Patent: Aug. 13, 2002

(54) TEMPERATURE AND HUMIDITY CONTROLLED PROCESSING SYSTEM

(75) Inventor: Issei Ueda, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/572,599

(22) Filed: May 17, 2000

(51) Int. Cl.⁷ .............................................. B05C 11/00
(52) U.S. Cl. ...................... 118/667; 118/666; 55/385.2
(58) Field of Search ................................. 118/666, 668, 118/669, 675, 676, 679, 680, 687, 688, 692; 55/385.2, 467.1, 467, 472

(56) References Cited

U.S. PATENT DOCUMENTS

| | | | |
|---|---|---|---|
| 5,326,316 A | * | 7/1994 | Hashimoto et al. .......... 454/187 |
| 5,779,799 A | * | 7/1998 | Davis .......................... 118/663 |
| 5,876,280 A | | 3/1999 | Kitano et al. ................ 454/187 |

FOREIGN PATENT DOCUMENTS

JP  11-135427  5/1999

\* cited by examiner

*Primary Examiner*—Curtis Mayes
*Assistant Examiner*—George R. Koch, III
(74) *Attorney, Agent, or Firm*—Rader, Fishman & Grauer, PLLC

(57) ABSTRACT

In each of a first block where processing for applying an antireflection film on a wafer is performed and a second block where processing for applying a resist film on the wafer is performed, clean air in a down flow is supplied from the top thereof through a temperature and humidity controller for controlling temperature and humidity, in a third block where processing for developing an exposed resist film is performed, clean air in a down flow is supplied from the top thereof through a temperature controller for controlling only temperature, and in a fourth block where transfer of the wafer between the blocks is performed, clean air in a down flow is supplied directly. Thereby, the cost of forming a system environment can be reduced.

14 Claims, 6 Drawing Sheets

TEMPERATURE AND HUMIDITY CONTROLLED PROCESSING SYSTEM

BACKGROUND OF THE INVENTION

1. Field of the Invention

The present invention relates to a processing system.

2. Description of the Related Art

In a photoresist process in the fabrication of a semiconductor device, for instance, a resist solution is supplied to a substrate such as a semiconductor wafer (hereinafter, referred to as wafer) or the like to form a resist film and after the resist film is exposed in a predetermined pattern, a developing solution is supplied to the wafer to develop the pattern. To perform such a series of processes, a coating and developing processing system has been conventionally used.

In the series of processes, it is necessary to adjust properly various environments such as temperature, humidity, ammonia concentration, a state of particles, and the like. To that end, conventionally, clean air blown out from a temperature controller is supplied from the top of the system to form a down flow of clean air in the coating and developing system and a chemical filter is inserted into a clean air supply port.

However, out of the series of processes, although the step of developing the resist film does not need much consideration of humidity compared with the step of forming the resist film, for example, control of humidity is actually performed more than necessary in the step of developing the resist film because the developing step is performed in the same environment as the step of forming the resist film. Moreover, although the step of developing the resist film does not need consideration of the number of particles compared with the step of forming the resist film, for example, clean air in a down flow is actually supplied more than necessary in the step of developing the resist film because the developing step is performed in the same environment as the step of forming the resist film. Furthermore, for instance, in a case where the series of processes has the step of forming an antireflection film on the wafer before applying the resist, there is a disadvantage that chemical filters more than necessary in number are used because clean air is supplied through the chemical filters though ammonia concentration is relatively insignificant in the above step. Consequently, there arises the problem of an increased cost of forming the system environment.

SUMMARY OF THE INVENTION

An object of the present invention is to provide a processing system capable of reducing the cost of forming a system environment.

To solve the above disadvantage, a processing system of the present invention is characterized by being divided into a first block where processing for applying an antireflection film on a substrate is performed; a second block where processing for applying a resist film on the substrate is performed; a third block where processing for developing an exposed resist film is performed; and a fourth block where transfer of the substrate between the blocks is performed, in which temperature and humidity are controlled for the first and second blocks, and temperature is controlled for the third block, and temperature is not controlled for the fourth block.

According to the configuration of the present invention, the system is divided into blocks in accordance with the nature of the processing so as to control environments suitably for each block, thereby reducing the cost of the formation of the system environment. Concretely, humidity during formation of a film exerts a great effect on the film thickness, while humidity during developing has no great influence on developing processing, and thus temperature and humidity are controlled for the first and second blocks and temperature is controlled for the third block without controlling humidity. Moreover, since temperature and humidity have no great influence on the substrate during transfer, the fourth block is not temperature-controlled. Thereby, facilities and the like to form the system environment are decreased on the whole to reduce cost.

These objects and still other objects and advantages of the present invention will become apparent upon reading the following specification when taken in conjunction with the accompanying drawings.

DETAILED DESCRIPTION OF THE PREFERRED EMBODIMENT

Hereinafter, preferred embodiments of the present invention will be described with reference to the drawings.

Figure 1:
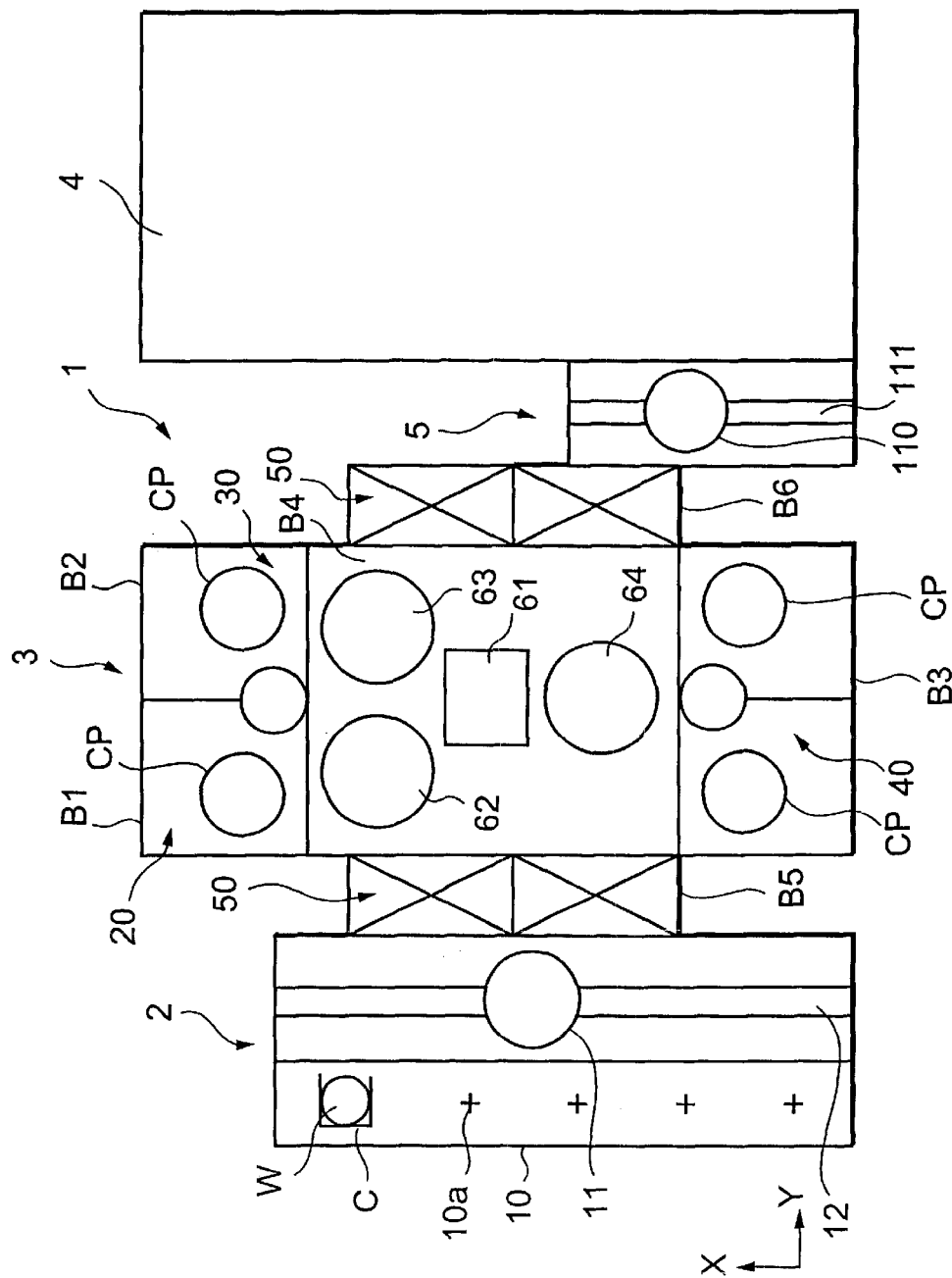
FIG. 1 is a plane view showing the structure of a coating and developing processing system according to an embodiment of the present invention.

FIG. 1 is a plane view showing the structure of a coating and developing processing system according to an embodiment of the present invention.

As shown in FIG. 1, a coating and developing processing system 1 has the structure in which a cassette station 2 for carrying, for example, 25 wafers W per cassette from/to the outside to/from the coating and developing processing system 1 and for carrying the wafers W into/out of a cassette C, a processing station 3 in which various processing units each for giving predetermined processing to the wafers W one by one in the coating and developing process are multi-tiered, and an interface section 5 for delivering the wafer W to/from an aligner 4 which is disposed adjacent to the processing station 3 are integrally connected.

In the cassette station 2, a plurality of cassettes C are mountable in a line in an X-direction (in a vertical direction in FIG. 1), with the respective ports for the wafer W facing the processing station 3 side at positions of positioning projections 10a on a cassette mounting table 10. A wafer transfer body 11 movable in the direction of arrangement of the cassettes C (the X-direction) and in the direction of arrangement of the wafers W housed in the cassettes C (a Z-direction; a vertical direction) can freely move along a transfer path 12 and selectively get access to each cassette C.

The wafer transfer body 11 is structured to be also rotatable in a θ-direction so as to be accessible to extension units 51 and alignment units 52 included in a fifth block B5 which will be explained later.

The processing station 3 is divided into blocks in accordance with the nature of processing. More specifically, the processing station 3 is divided into a first block B1 where processing for applying an antireflection film on the wafer W is performed, a second block B2 where processing for applying a resist film on the wafer W is performed, a third block B3 where processing for developing an exposed resist film is performed, fifth and sixth blocks B5 and B6 where heating processing is performed for the wafer W, and a fourth block B4 where transfer of the wafer W is performed between the blocks B1, B2, B3, B5, and B6. The first block B1 and the second block B2 are arranged to adjoin to each other on the back side of the processing station 3, the third block B3 is disposed on the front side of the processing station 3, the fourth block B4 is disposed to stand between the first block B1 and the second block B2, and the third block B3, and the fifth and sixth blocks B5 and B6 are disposed on both sides of the processing station 3.

In the above structure, an antireflection film coating unit group 20 is disposed in the first block B1, a resist coating unit group 30 is disposed in the second block B2, a developing processing unit group 40 is disposed in the third block B3, and heating processing unit groups 50 are disposed in the fifth and sixth blocks B5 and B6.

Figure 2:
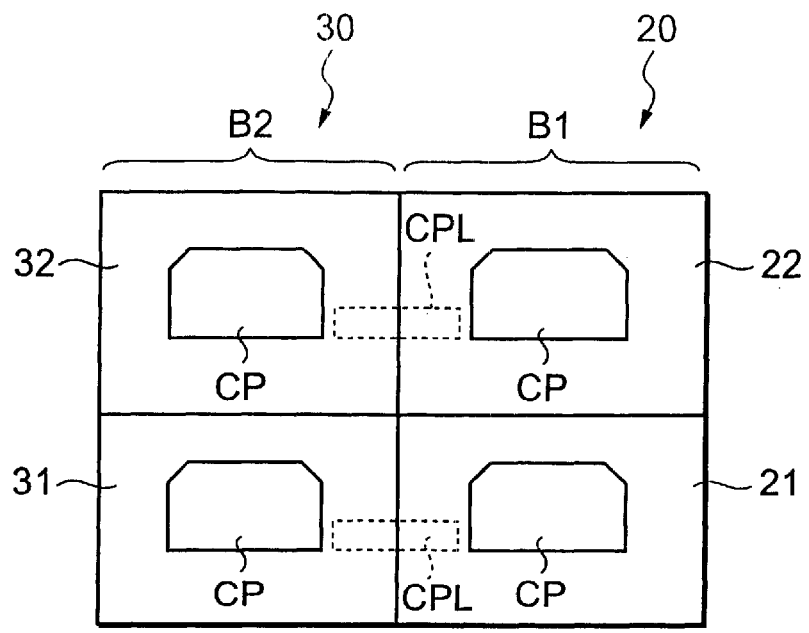
FIG. 2 is a diagram showing the structure of an antireflection film coating unit group and a resist coating unit group in the coating and developing processing system in FIG. 1.

As shown in FIG. 2, antireflection film coating units 21 and 22 each for performing antireflection film coating processing for the wafer W by applying an antireflection film to the wafer W while the wafer W is mounted on a spin chuck in a cup CP are vertically disposed in two tiers in the antireflection film coating unit group 20. Similarly, resist coating units 31 and 32 each for performing resist film coating processing for the wafer W by applying a resist film to the wafer W while the wafer W is mounted on a spin chuck in a cup CP are vertically disposed in two tiers in the resist coating unit group 30.

Figure 3:
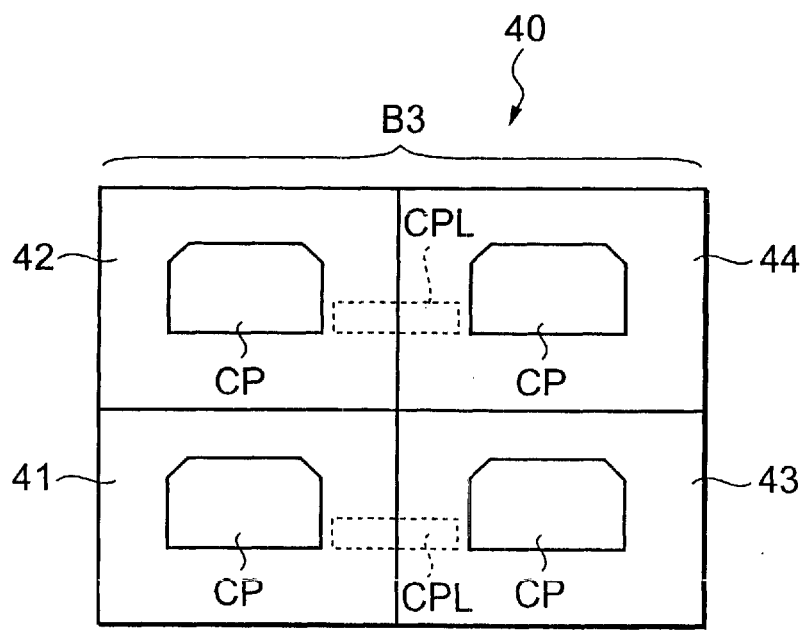
FIG. 3 is a diagram showing the structure of a developing processing unit group in the coating and developing processing system shown in FIG. 1.

As shown in FIG. 3, developing processing units 41 to 44 each for performing developing processing for the wafer W by supplying a developing solution to the wafer W while the wafer W is mounted on a spin chuck in a cup CP are disposed horizontally in two rows and vertically in two tiers in the developing processing unit group 40. Incidentally, a peripheral aligner unit may be disposed for one of the above units.

Here, between adjacent units, and concretely between the antireflection film coating unit 21 and the resist coating unit 31, between the antireflection film coating unit 22 and the resist coating unit 32, between the developing processing unit 41 and the developing processing unit 43, and between the developing processing unit 42 and the developing processing unit 44 disposed are cooling plates CPLs which are in the same atmosphere as the respective units. Each of the cooling plates CPLs is provided with a plurality of support pins (illustration thereof is omitted) for supporting the wafer W erected, for example, on the cooling plate.

Figure 4:
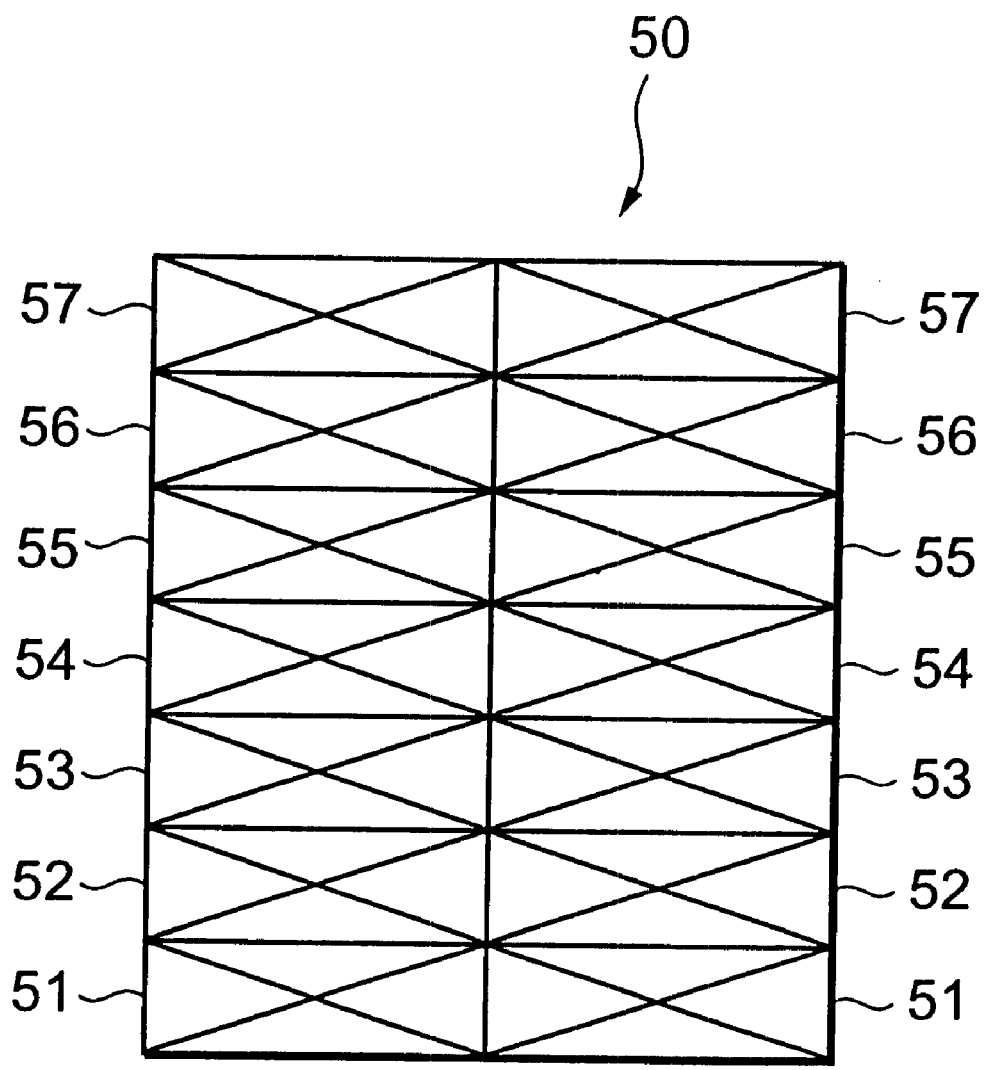
FIG. 4 is a diagram showing the structure of a heating processing unit group in the coating and developing processing system shown in FIG. 1.

As shown in FIG. 4, two sets of the alignment unit 51 for performing alignment of the wafer W, the extension unit 52 for allowing the wafer W to stand by therein, and heating processing units 53 to 57 for heating-processing the wafer W which are seven-tiered from the bottom, for example, are disposed adjoining to each other in the heating processing unit group 50.

At the central portion of the fourth block B4, a delivery table 61 mountable of the wafer W is provided. The antireflection film coating unit group 20 and the resist coating unit group 30, and the developing processing unit group 40 face each other with the delivery table 61 therebetween. A first transfer apparatus 62 is provided between the antireflection film coating unit group 20 and the delivery table 61, a second transfer apparatus 63 is provided between the resist coating unit group 30 and the delivery table 61, and a third transfer apparatus 64 is provided between the developing processing unit group 40 and the delivery table 61.

Figure 5:
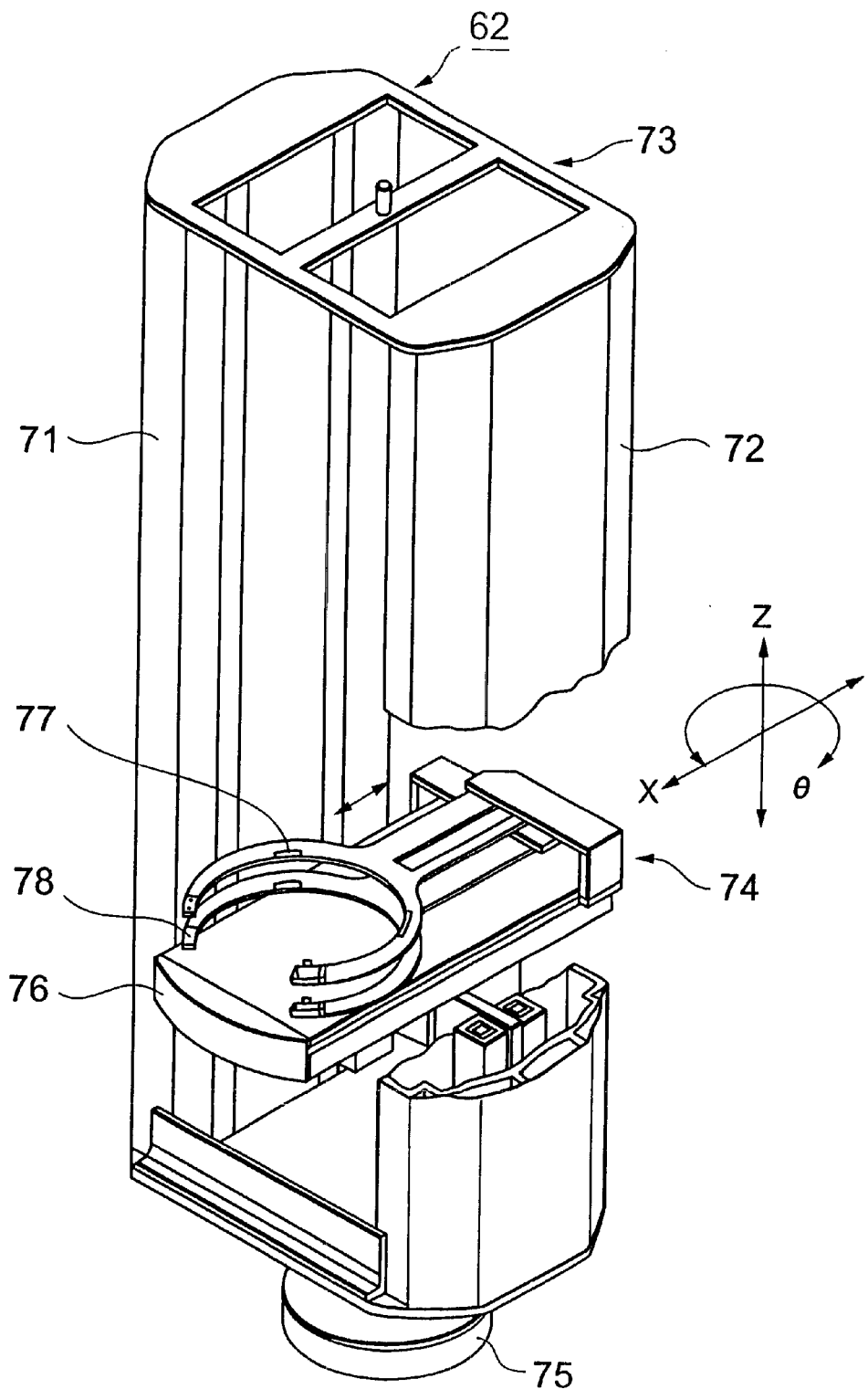
FIG. 5 is a diagram showing the structure of a first transfer apparatus in the coating and developing processing system shown in FIG. 1.

The first transfer apparatus 62, the second transfer apparatus 63, and the third transfer apparatus 64 have basically the same structure. Explaining the structure of the first transfer apparatus 62 with reference to FIG. 5, the first transfer apparatus 62 includes a wafer transfer means 74 ascendable and descendable in the vertical direction (the Z-direction) within a cylindrical support body 73 composed of wall portions 71 and 72 in one piece which are jointed with each other at respective top ends and bottom ends and face each other. The cylindrical support body 73 is connected to the rotation shaft of a motor 75 and rotated around the rotation shaft integrally with the wafer transfer means 74 by rotational drive force of the motor 75. Accordingly, the wafer transfer means 74 is rotatable in the θ-direction.

On a transfer base 76 of the wafer transfer means 74, a plurality of, for example, two tweezers 77 and 78 each for holding the wafer W are vertically provided. The tweezers 77 and 78 basically have the same structure and each have a shape and a size capable of passing through side opening portions between both the wall portions 71 and 72 of the cylindrical support body 73. Each of the tweezers 77 and 78 is movable forward and rearward by means of a motor (not shown) embedded in the transfer base 76.

A wafer transfer body 110 accessible to the extension units 51 and the alignment units 52 included in the sixth block B6 is provided in the interface section 5. The wafer transfer body 110 can freely move in the X-direction along a rail 111 and ascend and descend in the Z-direction (the vertical direction), and is also rotatable in the θ-direction. Thus, the wafer transfer body 110 is structured so as to transfer the wafer W to the aligner 4.

Figure 6:
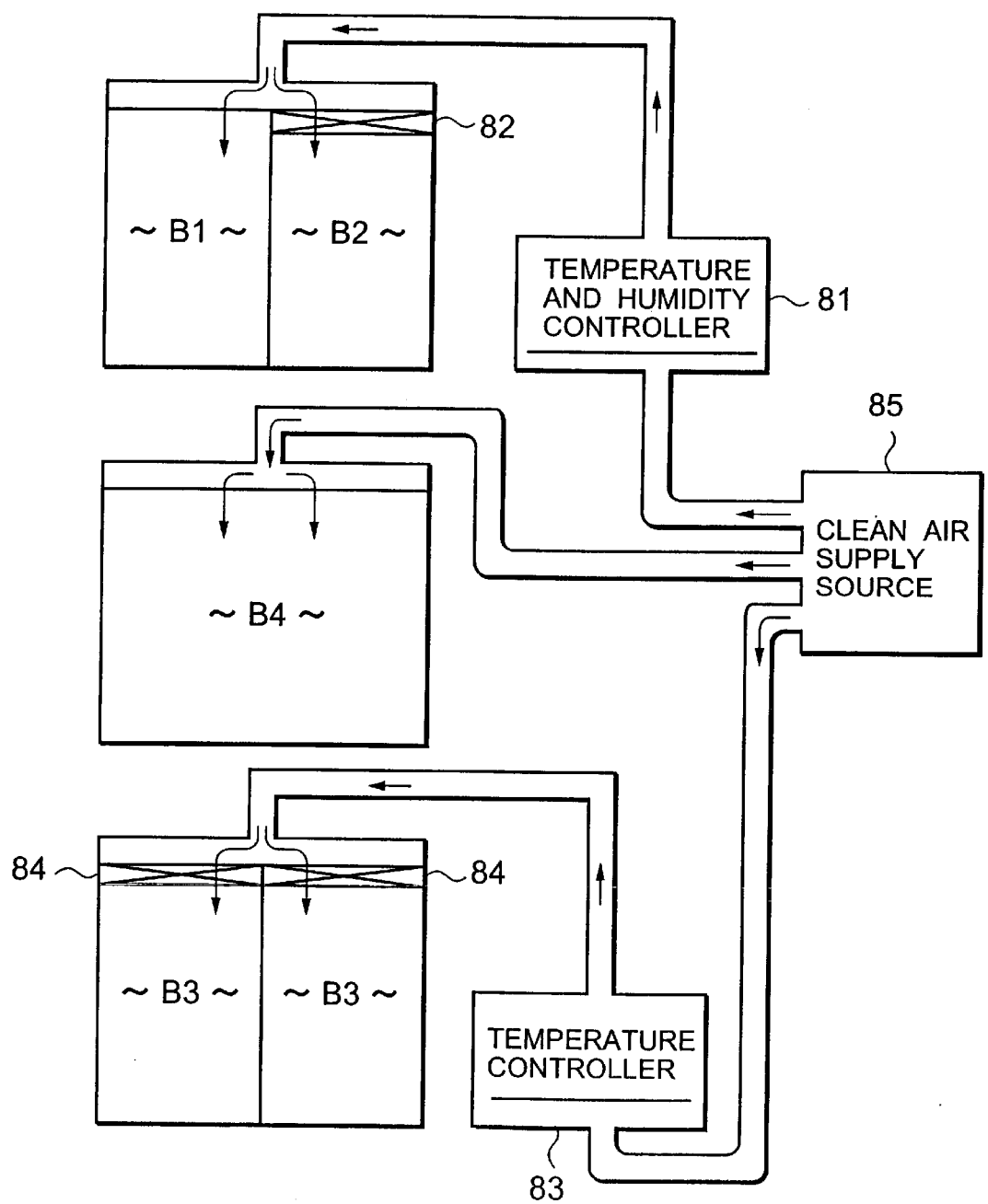
FIG. 6 is a diagram showing the configuration of a temperature control system in the coating and developing processing system according to an embodiment of the present invention.

Now, FIG. 6 is a diagram showing the configuration of a temperature control system in the coating and developing processing system according to this embodiment.

As shown in FIG. 6, in each of the first block B1 where processing for applying an antireflection film on the wafer W is performed and the second block B2 where processing for applying a resist film on the wafer W is performed, clean air in a down flow is supplied from the top thereof through a temperature and humidity controller 81 for controlling temperature and humidity. It should be noted that temperature-controlled clean air is supplied into the second block B2 through a chemical filter 82 and temperature-controlled air is supplied directly into the first block B1.

In the third block B3 where processing for developing an exposed resist film is performed, clean air in a down flow is supplied from the top thereof through a temperature controller 83 for controlling only temperature. It should be noted that temperature-controlled clean air is supplied to the third block B3 through a chemical filter 84.

Moreover, in the fourth block B4 where transfer of the wafer W is performed between the blocks, clean air in a down flow is supplied directly without the medium of a temperature controller or a chemical filter.

The above clean air is supplied from a clean air supply source 85.

Furthermore, in the coating and developing processing system 1 according to this embodiment, the blowout pressure of clean air in the second block B2 is made higher than that in the third block B3, whereby the second block B2 is held under a pressure more positive than the third block B3. The blowout pressure of clean air in the third block B3 is made higher than that in the fourth block B4, whereby the third block B3 is held under a pressure more positive than the fourth block B4. The blowout pressure of clean air in the fourth block B4 is made higher than that in the first block B1, whereby the fourth block B4 is held under a pressure more positive than the first block B1. Through the above relations, the first block B1 can be used as a collecting section for particles, so to speak, in the system especially when the antireflection film is not so important during exposure. However, when the antireflection film exerts a great effect during exposure, it is suitable to hold the second block B2 under a pressure more positive than the first block B1, the first block B1 under a pressure more positive than the third block B3, and the third block B3 under a pressure more positive than the fourth block B4.

The coating and developing processing system 1 according to the embodiment of the present invention is structured as above. Next, operations of the coating and developing processing system 1 will be explained.

First, the wafer transfer body 11 gets access to a cassette C to take out one unprocessed wafer W in the cassette station 2. Then, the wafer W is transferred to one of the alignment units 52 included in the fifth block B5 by the wafer transfer body 11. The wafer W for which alignment is completed in the alignment unit 52 is transferred to the cooling plate CPL disposed between the antireflection film coating unit 21 (22) and the resist coating unit 31 (32) by the first transfer apparatus 62. Sequentially, the cooled wafer W is transferred to the antireflection film coating unit 21 (22) to be coated with an antireflection film.

Then, the wafer W coated with the antireflection film is transferred to one of the heating processing units 53 to 57 included in the fifth block B5 by the first transfer apparatus 62. Sequentially, the wafer W which has undergone the heating processing is transferred to the cooling plate CPL disposed between the antireflection film coating unit 21 (22) and the resist coating unit 31 (32) by the first transfer apparatus 62. Sequentially, the cooled wafer W is transferred to the resist coating unit 31 (32) to be coated with a resist film.

Then, the wafer W coated with the resist film is transferred to one of the heating processing units 53 to 57 included in the sixth block B6 by the second transfer apparatus 63. Sequentially, the wafer W which has undergone the heating processing is transferred to one of the extension units 52 included in the sixth block B6 and stands by there.

Then, the wafer W is transferred from the extension unit 52 to the aligner 4 by the wafer transfer body 110 and is subjected to predetermined exposure processing.

The wafer w which has been exposed in a pattern in the aligner 4 is carried into one of the extension units 52 included in the sixth block B6 by the wafer transfer body 110 and further transferred to one of the heating processing units 53 to 57 included in the sixth block B6 by the third transfer apparatus 64. Then, the wafer W which has undergone the heating processing is transferred to the cooling plate CPL disposed between the developing processing unit 41 (42) and the developing processing unit 43 (44) by the third transfer apparatus 64. Sequentially, the wafer W which has undergone the cooling processing is transferred to the developing processing unit 41 or 43 (42 or 44) by the third transfer apparatus 64 to be subjected to developing processing.

Next, the wafer W which has undergone the developing processing is carried into one of the extension units 52 included in the fifth block B5 by the third transfer apparatus 64 and stands by there. Thereafter, the wafer W is carried out of the extension unit 52 by the wafer transfer body 11 and housed in a cassette C on the cassette mounting table 10. Thus, a series of coating and developing processing for the wafer W is completed.

As described above, the coating and developing processing system 1 of this embodiment is divided into the blocks B1 to B6 in accordance with the nature of processing so as to control environments, for example, temperature, humidity, pressure, and the like suitably for each block, thereby reducing the cost of the formation of the system environment.

Moreover, the second block is held under a pressure more positive than the third block, the third block is held under a pressure more positive than the fourth block, and the fourth block is held under a pressure more positive than the first block, that is, a block which is required to contain less particles is held under a more positive pressure so that particles flow into a block under a negative pressure, and thus it becomes unnecessary to make a down flow of clean air so strong.

Further, through the configuration in which temperature-controlled air is supplied into the second block through a chemical filter and temperature-controlled air is supplied directly into the first block, the number of chemical filters used can be reduced.

Furthermore, through the configuration in which first processing units each for applying an antireflection film on a substrate are disposed in the first block, second processing units each for applying a resist film on the substrate are disposed in the second block, third processing units each for developing an exposed resist film are disposed in the third block, and the number of the first processing units and the number of the second processing units are nearly equal and the total of the number of the first processing units and the number of the second processing units is nearly equal to the number of the third processing units, the most suitable system can be configured in accordance with a period of time for processing of each processing unit.

Furthermore, the first block and the second block adjoin to each other, the fourth block stands between the first block and the second block, and the third block, and the first transfer apparatus for the first block, the second transfer apparatus for the second block, the third transfer apparatus for the third block, and the delivery table for delivering the substrate between the transfer apparatuses are disposed in the fourth block, so that the most suitable system can be configured in accordance with a period of time for processing of each processing unit.

Further, cooling plates each for cooling the substrate before processing are disposed in the first block, the second block, and the third block respectively, so that cooling before processing can be performed in the environment most suitable for the processing.

Next, another embodiment of the present invention will be described.

Figure 7:
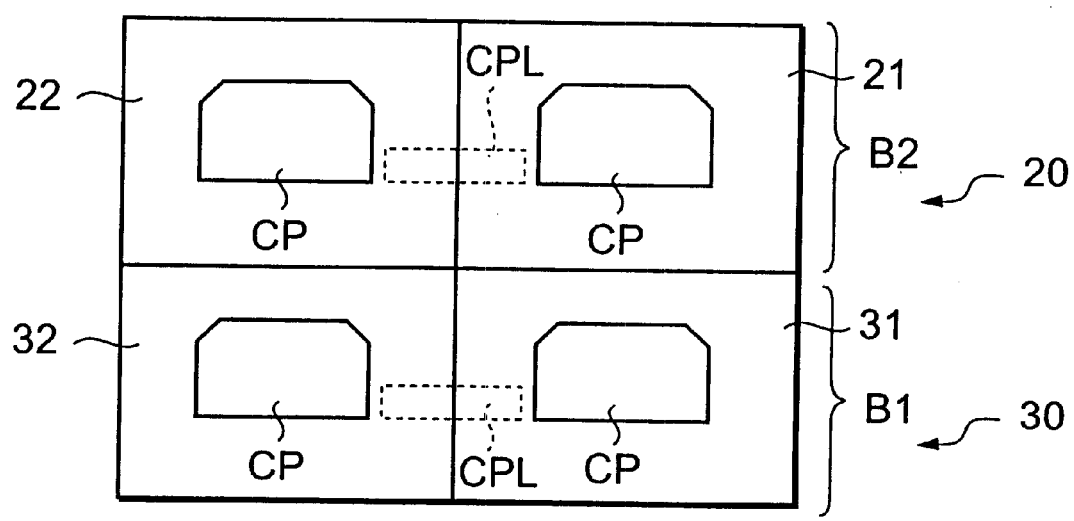
FIG. 7 is a diagram of the structure of an antireflection film coating unit group and a resist coating unit group according to another embodiment.

In the aforesaid embodiment, the first block B1 where processing for applying an antireflection film on the wafer W is performed and the second block B2 where processing for applying a resist film on the wafer W is performed are disposed adjoining to each other. However, there is no harm in disposing the second block B2 on top of the first block B1 as shown in FIG. 7. In this case, temperature control in the second block B2 can be performed more precisely, thereby applying the resist film more uniformly in thickness. Also in this case, the first block B1 and the second block B2 are held under pressures more positive than the third block B3 and the third block B3 is held under a pressure more positive than the fourth block B4, thereby minimizing the effect of particles exerted on the system.

It should be noted that the description is presented taking a wafer as an example of a substrate in the aforesaid embodiments, but the present invention can be applied to another substrate such as an LCD substrate or the like. It is needless to say that temperature-controlled clean air may be supplied also to the first block B1 through a chemical filter.

The aforesaid embodiments have the intention of clarifying technical meaning of the present invention. Therefore, the present invention is not intended to be limited to the above concrete embodiments and to be interpreted in a narrow sense, and various changes may be made therein without departing from the spirit of the present invention and within the meaning of the claims.

What is claimed is:

1. A processing system, comprising:
   a first block where processing for applying an antireflection film on a substrate is performed;
   a second block where processing for applying a resist film on the substrate is performed;
   a third block where processing for developing an exposed resist film is performed;
   a fourth block where transfer of the substrate between said first block, said second block and said third block is performed;
   means for controlling temperature and humidity for said first and second blocks; and
   means for controlling temperature without controlling humidity for said third block,
   wherein the first block and the second block are disposed on an opposite side to the third block with respect to the fourth block so as that each environment of the first block and the second block can be controlled independently on an environment of the third block.

2. The system as set forth in claim 1, further comprising:
   means for holding said second block under a pressure more positive than said third block, said third block under a pressure more positive than said fourth block, and said fourth block under a pressure more positive than said first block.

3. The system as set forth in claim 1, further comprising:
   means for holding said second block under a pressure more positive than said first block, said first block under a pressure more positive than said third block, and said third block under a pressure more positive than said fourth block.

4. The system as set forth in claim 1,
   wherein temperature-controlled air is supplied into said second block through a chemical filter and temperature-controlled air is supplied into said first block directly.

5. The system as set forth in claim 1, further comprising:
   means for controlling said system so that after the antireflection film is applied on the substrate in said first block, the resist film is applied on the substrate in said second block, and thereafter the resist film after exposure is developed in said third block.

6. The system as set forth in claim 1,
   wherein first processing units each for applying the antireflection film on the substrate are disposed in said first block, second processing units each for applying the resist film on the substrate are disposed in said second block, and third processing units each for developing the exposed resist film are disposed in said third block,
   wherein the number of the first processing units and the number of the second processing units are nearly equal, and
   wherein the total of the number of the first processing units and the number of the second processing units is nearly equal to the number of the third processing units.

7. The system as set forth in claim 1,
   wherein said first block and said second block adjoin to each other and said fourth block stands between said first block and said second block, and said third block, and
   wherein a first transfer apparatus for said first block, a second transfer apparatus for said second block, a third transfer apparatus for said third block, and a delivery table for delivering the substrate between the transfer apparatuses are disposed in said fourth block.

8. The system as set forth in claim 1,
   wherein cooling plates for cooling the substrate before processing are disposed in said first block, said second block, and said third block respectively.

9. The system as set forth in claim 1,
   wherein said second block is temperature-controlled more precisely than said first block.

10. A processing system, comprising:
    a first block where processing for applying an antireflection film on a substrate is performed;
    a second block, disposed on top of said first block, where processing for applying a resist film on the substrate is performed;
    a third block where processing for developing an exposed resist film is performed;
    a fourth block where transfer of the substrate between said first block, said second block, and said third block is performed;
    means for supplying clean air temperature and humidity of which are controlled from the top of said first block and said second block toward the bottom;
    means for supplying clean air temperature of which is controlled without controlling humidity from the top of said third block toward the bottom; and
    means for supplying clean air from the top of said fourth block toward the bottom,
    wherein the first block and the second block are disposed on an opposite side to the third block with respect to the fourth block so as that each environment of the first block and the second block can be controlled independently of an environment of the third block.

11. The system as set forth in claim 10, further comprising:
    means for holding said first block and said second block under pressures more positive than said third block and said third block under a pressure more positive than said fourth block.

12. A processing system, comprising:

a first block where processing for applying an antireflection film on a substrate is performed;

a second block where processing for applying a resist film on the substrate is performed;

a third block where processing for developing an exposed resist film is performed;

a fourth block where transfer of the substrate between said first block, said second block, and said third block is performed; and means for holding said second block under a pressure more positive than said third block, said third block under a pressure more positive than said fourth block, and said fourth block under a pressure more positive than said first block, wherein the first block and the second block are disposed on an opposite side to the third block with respect to the fourth block so as that each environment of the first block and the second block can be controlled independently of an environment of the third block.

13. A processing system, comprising:

a first block where processing for applying an antireflection film on a substrate is performed;

a second block where processing for applying a resist film on the substrate is performed;

a third block where processing for developing an exposed resist film is performed;

a fourth block where transfer of the substrate between said first block, said second block, and said third block is performed; and means for holding said second block under a pressure more positive than said first block, said first block under a pressure more positive than said third block, and said third block under a pressure more positive than said fourth block, wherein the first block and the second block are disposed on an opposite side to the third block with respect to the fourth block so as that each environment of the first block and the second block can be controlled independently of an environment of the third block.

14. A processing system, comprising:

a first block where processing for applying an antireflection film on a substrate is performed;

a second block, disposed on top of said first block, where processing for applying a resist film on the substrate is performed;

a third block where processing for developing an exposed resist film is performed;

a fourth block where transfer of the substrate between said first block, said second block, and said third block is performed; and means for holding said first block and said second block under pressure more positive than said third block and said third block under a pressure more positive than said fourth block, wherein the first block and the second block are disposed on an opposite side to the third block with respect to the fourth block so as that each environment of the first block and the second block can be controlled independently of an environment of the third block.

* * * * *